US009546318B2

United States Patent
Murphy et al.

(10) Patent No.: US 9,546,318 B2
(45) Date of Patent: *Jan. 17, 2017

(54) PROCESS FOR PREPARING RED-EMITTING PHOSPHORS

(71) Applicant: GENERAL ELECTRIC COMPANY, Schenectady, NY (US)

(72) Inventors: James Edward Murphy, Niskayuna, NY (US); Robert Joseph Lyons, Burnt Hills, NY (US); Anant Achyut Setlur, Jr., Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 380 days.

This patent is subject to a terminal disclaimer.

(21) Appl. No.: 14/267,449

(22) Filed: May 1, 2014

(65) Prior Publication Data

US 2015/0315462 A1    Nov. 5, 2015

(51) Int. Cl.
*C09K 11/61*    (2006.01)
*C09K 11/66*    (2006.01)
(Continued)

(52) U.S. Cl.
CPC ............. *C09K 11/617* (2013.01); *C01B 33/10* (2013.01); *C09K 11/616* (2013.01);
(Continued)

(58) Field of Classification Search
CPC ... C09K 11/02; C09K 11/0838; C09K 11/616; C09K 11/617; C09K 11/675; C09K 11/628; C09K 11/645; C09K 11/665; C09K 11/664; C09K 2211/181; C09K 2211/188; H01L 33/502; H01L 33/504; H01L 33/507; H01L 33/52; H05B 33/14; Y02B 20/181; Y10T 428/2991
(Continued)

(56) References Cited

U.S. PATENT DOCUMENTS

| | | |
|---|---|---|
| 2,447,359 A | 8/1948 | Oakley, Jr. |
| 3,576,756 A | 4/1971 | Russo |

(Continued)

FOREIGN PATENT DOCUMENTS

| | | |
|---|---|---|
| GB | 1360690 A | 7/1974 |
| JP | 2010209311 A | 9/2010 |

(Continued)

OTHER PUBLICATIONS

Ryota et al., "Photoluminescent properties of cubic K2MnF6 particles synthesized in metal immersed HF/KMnO4 solutions", Journal of Applied Physics, Dec. 2010, pp. 113503-1-113503-6, vol. 108, Issue 11.

(Continued)

*Primary Examiner* — Matthew E Hoban
*Assistant Examiner* — Lynne Edmondson
(74) *Attorney, Agent, or Firm* — Mary Louise Stanford

(57) ABSTRACT

A process for preparing a $Mn^{4+}$ doped phosphor of formula I $$A_x[MF_y]:Mn^{+4} \qquad \qquad I$$

includes contacting a mixture of a compound of formula $A_x[MF_y]$, a compound of formula AX, and a $Mn^{+n}$ source comprising a fluoromanganese compound, with a fluorine-containing oxidizing agent in gaseous form, at an elevated temperature, to form the $Mn^{4+}$ doped phosphor;
wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
X is F, Cl, Br, I, $HF_2$, or a combination thereof;
x is the absolute value of the charge of the $[MF_y]$ ion;
y is 5, 6 or 7; and
n is 2, 3, or 4.

13 Claims, 3 Drawing Sheets

(51) Int. Cl.
*H01L 33/50* (2010.01)
*C01B 33/10* (2006.01)

(52) U.S. Cl.
CPC .. *H01L 33/502* (2013.01); *H01L 2224/48091* (2013.01); *H01L 2224/48247* (2013.01); *H01L 2924/181* (2013.01)

(58) Field of Classification Search
USPC ...... 252/301.4 F, 301.4 H, 301.4 R, 301.6 F; 313/486, 503; 362/84, 97.1; 428/403; 257/98
See application file for complete search history.

(56) References Cited

U.S. PATENT DOCUMENTS

| | | | |
|---|---|---|---|
| 7,358,542 B2 | 4/2008 | Radkov et al. | |
| 7,497,973 B2 | 3/2009 | Radkov et al. | |
| 7,648,649 B2 | 1/2010 | Radkov et al. | |
| 7,847,309 B2 | 12/2010 | Radkov et al. | |
| 8,057,706 B1 * | 11/2011 | Setlur | C09K 11/02 252/301.4 F |
| 8,252,613 B1 * | 8/2012 | Lyons | C09K 11/617 438/45 |
| 8,491,816 B2 | 7/2013 | Hong et al. | |
| 8,710,487 B2 * | 4/2014 | Lyons | C09K 11/617 257/13 |
| 8,906,724 B2 * | 12/2014 | Murphy | H01L 33/502 438/34 |
| 2010/0013373 A1 * | 1/2010 | Hata | H01L 33/504 313/502 |
| 2010/0091215 A1 | 4/2010 | Fukunaga et al. | |
| 2012/0256125 A1 | 10/2012 | Kaneyoshi et al. | |
| 2013/0264937 A1 | 10/2013 | Sakuta et al. | |

FOREIGN PATENT DOCUMENTS

| | | |
|---|---|---|
| JP | 2012064503 A | 3/2012 |
| WO | 2006028271 A2 | 3/2006 |
| WO | 2009119486 A1 | 10/2009 |
| WO | 2013088313 A1 | 6/2013 |
| WO | 2013121355 A1 | 8/2013 |
| WO | 2013138347 A1 | 9/2013 |

OTHER PUBLICATIONS

Adachi et al., "Direct synthesis and properties of K2SiF6:Mn4+ phosphor by wet chemical etching of Si wafer", Journal of Applied Physics, Mar. 30, 2008, pp. 023512-1-023512-3, vol. 104, Issue 2.
Ryota et al. "Red and Deep Red Emissions from Cubic K2SiF6:Mn4+ and Hexagonal K2MnF6 Synthesized in HF/KMnO4/KHF2/Si Solutions", Journal of the Electrochemical Society, Dec. 21, 2011, pp. J89-J95, vol. 159, Issue 4.
Paulusz, "Efficient Mn(IV) Emission in Fluorine Coordination", Journal of the Electrochemical Society, Jul. 1973, pp. 942-947, vol. 120, Issue 7.
Takahashi et al., "Mn4+-Activated Red Photoluminescence in K2SiF6 Phosphor", Journal of the Electrochemical Society, vol. No. 155, Issue No. 12, pp. E183-E188, 2008.
Arai et al., "A Yellow Phosphor K2SiF6 Activated by Mn2+ Ions", Journal of Applied Physics, vol. No. 108, pp. 1-7, 2010.
Xu et al., "Properties of Mn4+-Activated Hexafluorotitanate Phosphors", Journal of the Electrochemical Society, vol. No. 158, Issue No. 3, pp. J58-J65, 2011.
European Search Report and Opinion issued in connection with corresponding EP Application No. 15165904.2 on Jul. 16, 2015.
U.S. Appl. No. 14/267,434, Robert Joseph Lyons et al., filed May 1, 2014.
Bode et al., "On a New Production of Potassium-Hexafluoromanganate(IV)", Angewandte Chemie, vol. No. 65, Issue No. 11, pp. 304, Jun. 7, 1953.
Mariusz et al., "Synthesis and Luminescent Properties of Red-Emitting Phosphors: ZnSiF6.6H2O and ZnGeF6.6H2O Doped with Mn4+", Journal of Luminescence, vol. No. 137, pp. 88-92, Jan. 4, 2013.
European Search Report and Opinion issued in connection with corresponding EP Application No. 15165675.8 on Sep. 18, 2015.

* cited by examiner

PROCESS FOR PREPARING RED-EMITTING PHOSPHORS

CROSS-REFERENCE TO RELATED APPLICATIONS

This application is related to U.S. patent application filed concurrently herewith under attorney docket number 270388-1, the entire disclosure of which is incorporated herein by reference.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

Methods for preparation of the phosphors typically require hydrofluoric acid as a solvent. For example, WO 2007/100824 describes preparation of complex fluoride phosphors using aqueous HF as solvent. The processes utilize significant quantities of this highly toxic material, and alternatives that eliminate HF or at least reduce the amount are economically advantageous.

BRIEF DESCRIPTION

Briefly, in one aspect, the present invention relates to an HF-free process for preparing a $Mn^{4+}$ doped phosphor of formula I

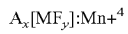

$$A_x[MF_y]:Mn+^4 \quad \text{I}$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a
combination thereof;
x is the absolute value of the charge of the $[MF_y]$ ion;
y is 5, 6 or 7; and
n is 2 or 3.

The process includes contacting a mixture of a compound of formula $A_x[MF_y]$, a compound of formula AX, where X is F, Cl, Br, I, $HF_2$, or a combination thereof, and a $Mn^{+n}$ source comprising a fluoromanganese compound with a fluorine-containing oxidizing agent in gaseous form, at an elevated temperature, to form the $Mn^{4+}$ doped phosphor.

In another aspect, the present invention relates to a process for preparing a $Mn^{4+}$ doped phosphor selected from
(A) $A_2[MF_5]:Mn^{4+}$, where M is selected from Al, Ga, In, and combinations thereof;
(B) $A_3[MF_6]:Mn^{4+}$, where M is selected from Al, Ga, In, and combinations thereof;
(C) $Zn_2[MF_7]:Mn^{4+}$, where M is selected from Al, Ga, In, and combinations thereof;
(D) $A[In_2F_7]:Mn^{4+}$;
(E) $A_2[MF_6]:Mn^{4+}$, where M is selected from Ge, Si, Sn, Ti, Zr, and combinations thereof;
(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;
(G) $Ba_{0.65}Zr_{0.35}F_{2.70}:Mn^{4+}$;
(H) $A_3[ZrF_7]:Mn^{4+}$; and combinations thereof in solid solution;
wherein A is Li, Na, K, Rb, Cs, or a combination thereof.

The process includes contacting a mixture of a host compound of the phosphor, a compound of formula AX or $EX_2$, and a $Mn^{+n}$ source comprising a fluoromanganese compound; with a fluorine-containing oxidizing agent in gaseous form, at an elevated temperature, to form the $Mn^{4+}$ doped phosphor;
wherein the host compound is selected from the group consisting of
(a) $A_2[MF_5]$, where M is selected from Al, Ga, In, and combinations thereof;
(b) $A_3[MF_6]$, where M is selected from Al, Ga, In, and combinations thereof;
(c) $Zn_2[MF_7]$, where M is selected from Al, Ga, In, and combinations thereof;
(d) $A[In_2F_7]$;
(e) $A_2[MF_6]$, where M is selected from Ge, Si, Sn, Ti, Zr, and combinations thereof;
(f) $E[MF_6]$, where E is selected from Mg, Ca, Sr, Ba, Zn, and combinations thereof; and
where M is selected from Ge, Si, Sn, Ti, Zr, and combinations thereof;
(g) $Ba_{0.65}Zr_{0.35}F_{2.70}$; and
(h) $A_3[ZrF_7]$; and combinations thereof in solid solution;
A is Li, Na, K, Rb, Cs, or a combination thereof.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
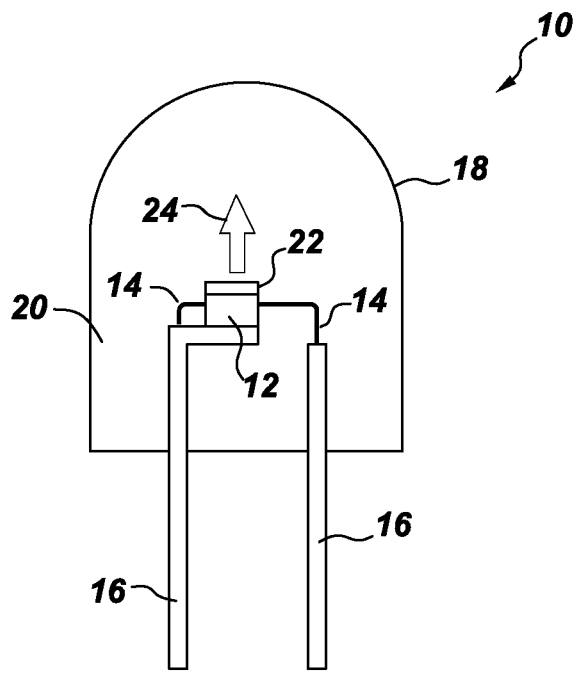
FIG. 1 is a schematic cross-sectional view of a lighting apparatus in accordance with one embodiment of the invention.

In a process of the present invention, the mixture of starting materials may be contacted with the fluorine-containing oxidizing agent under dry, or solvent-free conditions. The process uses no HF, since no solvent is required. Under some conditions, HF may be produced as a byproduct of the process, but the amount generated is far below the amount that would be used in a process that includes HF as the solvent.

The mixture includes the host compound of the $Mn^{4+}$ doped phosphors, which is the compound of formula $A_x[MF_y]$ for phosphors of formula I, or host compounds (a) through (h) for phosphors of formula (A) through (H). Examples of the compound of formula $A_x[MF_y]$ include $K_2[SiF_6]$, $K_2[TiF_6]$, $Cs_2[TiF_6]$, $Rb_2[TiF_6]$, $Cs_2[SiF_6]$, $Rb_2[SiF_6]$, $Na_2[TiF_6]$, $Na_2[ZrF_6]$, $K_3[ZrF_7]$, $K_3[BiF_6]$, $K_3[YF_6]$, $K_3[LaF_6]$, $K_3[GdF_6]$, $K_3[NbF_7]$, and $K_3[TaF_7]$, where the phosphor of formula I is $K_2[SiF_6]$:$Mn^{4+}$, $K_2[TiF_6]$:$Mn^{4+}$, $Cs_2[TiF_6]$:$Mn^{4+}$, $Rb_2[TiF_6]$:$Mn^{4+}$, $Cs_2[SiF_6]$:$Mn^{4+}$, $Rb_2[SiF_6]$:$Mn^{4+}$, $Na_2[TiF_6]$:$Mn^{4+}$, $Na_2[ZrF_6]$:$Mn^{4+}$, $K_3[ZrF_7]$:$Mn^{4+}$, $K_3[BiF_6]$:$Mn^{4+}$, $K_3[YF_6]$:$Mn^{4+}$, $K_3[LaF_6]$:$Mn^{4+}$, $K_3[GdF_6]$:$Mn^{4+}$, $K_3[NbF_7]$:$Mn^{4+}$, or $K_3[TaF_7]$:$Mn^{4+}$. In particular embodiments, the coordination center M is Si, Ge, Sn, Ti, Zr, or a combination thereof. More particularly, the coordination center is Si, Ge, Ti, or a combination thereof, the counterion A in formula I is Na, K, Rb, Cs, or a combination thereof, and y is 6.

The compound of formula AX or $EX_2$ is a source of $A^+$ cations for the phosphor. Examples of suitable materials for AX include KF and $KHF_2$.

Fluoromanganese compounds suitable for use as the $Mn^{n+}$ source include $Mn^{2+}$ sources and $Mn^{3+}$ sources. Examples of $Mn^{2+}$ sources include $K_2MnF_4$, $KMnF_3$, $MnF_2$, manganese (II) acetate, manganese (II) oxide, manganese (II) carbonate, manganese (II) nitrate, and combinations thereof. Examples of $Mn^{3+}$ sources include $K_2MnF_5 \cdot H_2O$, $KMnF_4$, and $MnF_3$, manganese (III) acetate, manganese (III) oxide, and combinations thereof. Hydrated forms of the $Mn^{n+}$ sources may produce low concentrations of HF.

Amounts of the starting material may be determined by the stoichiometry of the reaction to form the phosphor. Deviations from nominal stoichiometry, as known in the art, are possible. For example, the preparation of $K_2SiF_6$:$Mn^{4+}$ containing x mol % Mn is shown in Equation I.

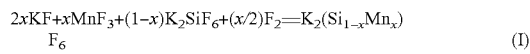
$$2x\text{KF} + x\text{MnF}_3 + (1-x)\text{K}_2\text{SiF}_6 + (x/2)\text{F}_2 = \text{K}_2(\text{Si}_{1-x}\text{Mn}_x)\text{F}_6 \qquad (I)$$

To prepare one mole of the phosphor using $MnF_3$ as the Mn source, the relative amounts of starting materials are:

| Starting material | Moles |
|---|---|
| KF | 2x |
| $MnF_3$ | 1x |
| $K_2SiF_6$ | (1 − x) |

In particular embodiments, the phosphor of formula I is $K_2SiF_6$:$Mn^{4+}$, and the $Mn^{n+}$ source is combined with the host compound $K_2SiF_6$ and KF to yield the $Mn^{4+}$ doped phosphor. The $Mn^{n+}$ source may be $K_2MnF_6$, $MnF_2$, $MnF_3$, or a combination thereof.

The mixture may be converted to the $Mn^{4+}$ doped phosphor by contact with a fluorine-containing oxidizing agent in gaseous form at an elevated temperature. The temperature may range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The mixture is contacted with the oxidizing agent for a period of time sufficient to convert it to a Me doped phosphor. Time and temperature are interrelated, and may be adjusted together, for example, increasing time while reducing temperature, or increasing temperature while reducing time. The contacting step may include multiple periods of contact, of varying time and temperature, and the materials may be rehomogenized between the periods to improve uniformity of the treatment. In particular embodiments, the mixture is contacted with the oxidizing agent for a period of at least eight hours and a temperature of at least 250° C., for example, at about 425° C. for about four hours and then at a temperature of about 560° C. for about four hours.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, $KrF$, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, and combinations with the fluorine-containing oxidizing agent. In particular embodiments, the atmosphere contains about 20% $F_2$ and about 80% nitrogen.

The manner of contacting the mixture with the fluorine-containing oxidizing agent is not critical and may be accomplished in any way sufficient to convert the mixture to a phosphor having the desired properties. In some embodiments, the chamber containing the mixture may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In another aspect, the present invention relates to a process that includes contacting a mixture of a phosphor precursor and a flux compound with a fluorine-containing oxidizing agent in gaseous form at an elevated temperature, to form the $Mn^{4+}$ doped phosphor. Phosphor precursors that are transformed into the phosphor may be deficient in $A^+$ relative to the product $Mn^{4+}$ doped phosphor, that is, where the ratio $[A^+]/([Mn^{n+}]+[M])$ is less than or equal to 2, but are not limited thereto. Examples include compounds of formula I, including potassium-deficient compounds, particularly K-deficient $K_2SiF_6$:$Mn^{4+}$, and $Mn^{2+}$- and $Mn^{3+}$-containing precursors of formula III

$$A_m[MF_z]:Mn^{n+} \qquad III$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
m is the absolute value of the charge of the $[MF_z]$ ion;
$4 \leq z \leq 7$; and
n is 2 or 3.

Precursors of formula III may be a single phase material, or may contain multiple phases having the average composition of formula III.

The flux compound is selected from compounds of formula AX, $EX_2$, $MF_2$ or $MF_3$, where M is Si, Ge, Sn, Ti, Zr, Al, Ga, In, Sc, Hf, Y, La, Nb, Ta, Bi, Gd, or a combination thereof. Suitable materials for use as flux compounds include monofluorides and bifluorides of potassium, sodium and rubidium, KF and $KHF_2$, NaF and Na $HF_2$, RbF and $RbHF_2$, $BiF_3$, $AlF_3$, $YF_3$, $LaF_3$, $GdF_3$, $GaF_3$, $InF_3$, $ScF_3$, $PbF_2$, and $SnF_2$. In particular embodiments, the flux material is KF or $KHF_2$, or a combination thereof. The flux material may be removed from the phosphor product by washing with a suitable solvent, such as acetic acid.

Color stability and quantum efficiency of phosphors prepared by a process according to the present invention may be enhanced by treating the phosphor in particulate form with a saturated solution of a composition of formula II $$A_x[MF_y]$$ II in aqueous hydrofluoric acid, as described in U.S. Pat. No. 8,252,613. For example, $K_2SiF_6$:$Mn^{4+}$ maybe treated with a solution of $K_2SiF_6$ in HF at room temperature to improve color stability and quantum efficiency of the phosphor. The temperature at which the phosphor is contacted with the solution ranges from about 20° C. to about 50° C. The period of time required to produce the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

$Mn^{4+}$ doped phosphors prepared by a process according to the present invention may display good color stability after exposure to light flux. A lighting apparatus incorporating a $Mn^{4+}$ doped phosphor prepared by a process according to the present invention may have a color shift of ≤1.5 MacAdam ellipses after operating for at least 2,000 hour at a LED current density greater than 2 A/cm$^2$, a LED wall-plug efficiency greater than 40%, and a board temperature greater than 25° C., preferably wherein the MacAdam ellipse color shift is ≤1. Under accelerated test conditions, the lighting apparatus may have a color shift of ≤2 MacAdam ellipses after operating for 30 minutes at a LED current density greater than 70 A/cm$^2$, a LED wall-plug efficiency greater than 18%, and a board temperature greater than 25° C. Stability of the phosphor outside an LED package as measured by % intensity loss of the phosphor after exposure to light flux of at least 80 w/cm$^2$ at a temperature of at least 50° C.; % intensity loss of the color stable phosphors may be ≤4% after 21 hours.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where 0≤i, 0≤j; 0≤k and 1+j+k=1) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
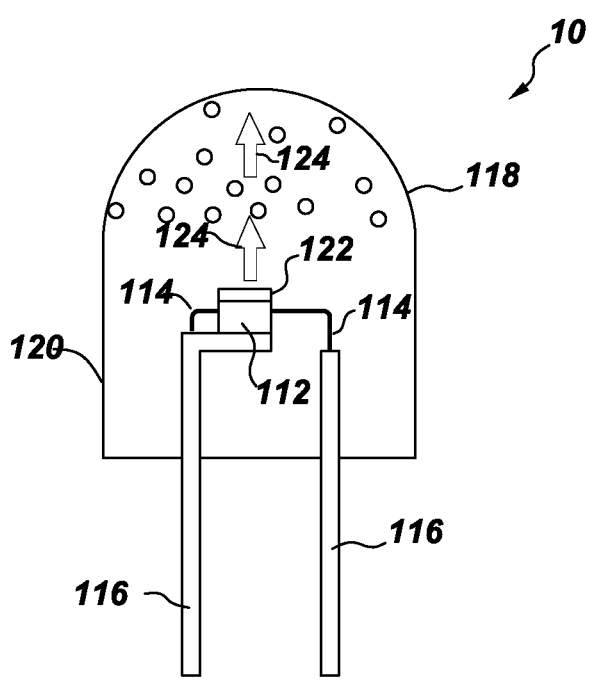
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
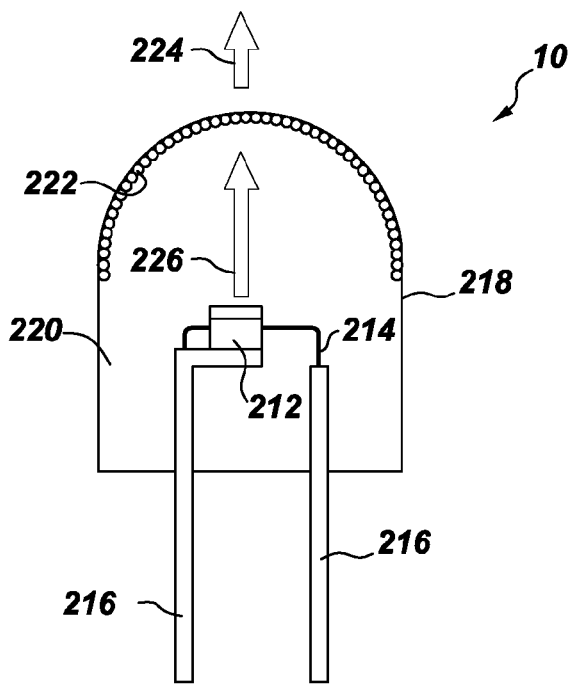
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
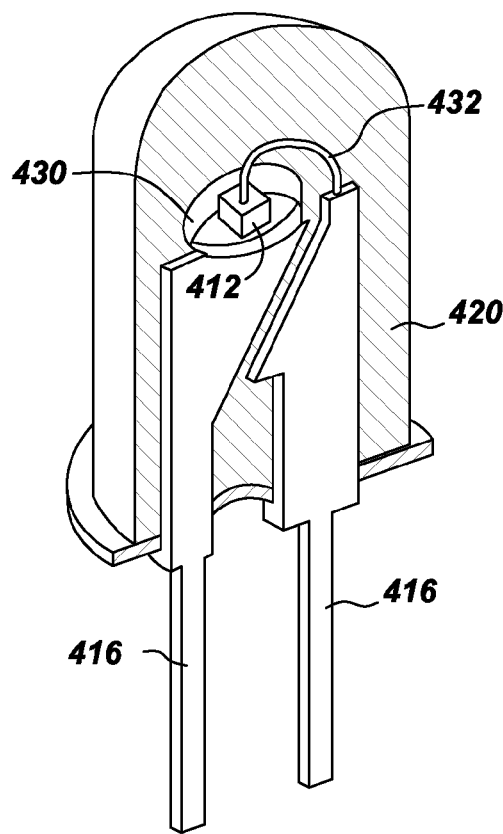
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
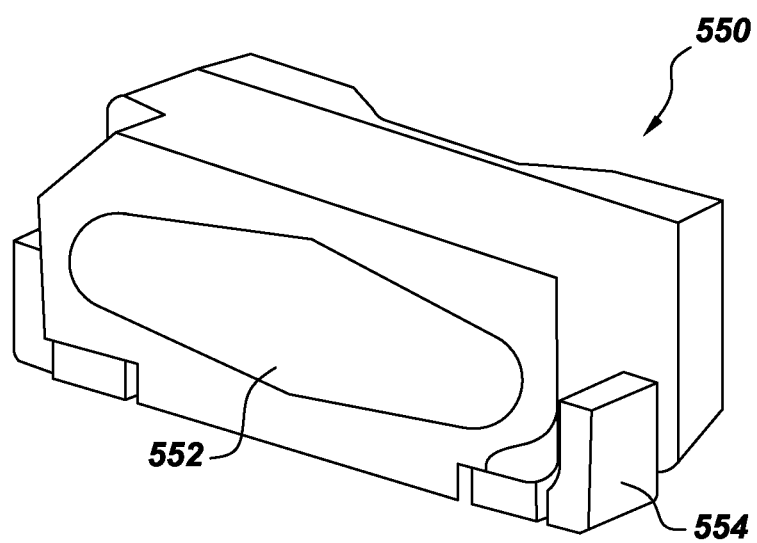
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source and a $Mn^{4+}$ doped phosphor prepared by a process according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4, 6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:

$((Sr_{1-z}(Ca, Ba, Mg, Zn)_z)_{1-(x+w)}(Li, Na, K, Rb)_w Ce_x)_3 (Al_{1-y}Si_y)O_{4+y3+(x-w)}F_{1-y-3(x-w)}$, $0<x\leq0.10$, $0\leq y\leq0.5$, $0\leq z\leq0.5$, $0\leq w\leq x$;

$(Ca, Ce)_3Sc_2Si_3O_{12}$(CaSiG);

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;

$(Sr,Ca)_{10}(PO_4)_6*vB_2O_3:Eu^{2+}$ (wherein $0<v\leq1$); $Sr_2Si_3O_8*2SrCl_2:Eu^{2+}$;

$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;

$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$;

$(Y,Gd,Tb,La,Sm,Pr,Lu)_3(Al,Ga)_{5-\alpha}O_{12-3/2\alpha}:Ce^{3+}$ (wherein $0\leq\alpha\leq0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$;

$(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$;

$CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$;

$(Ba,Sr,Ca)_\beta Si_\gamma N_\mu:Eu^{2+}$ (wherein $2\beta+4\gamma=3\mu$); $Ca_3(SiO_4)Cl_2:Eu^{2+}$;

$(Lu,Sc,Y,Tb)_{2-u-v}Ce_vCa_{1+u}Li_wMg_{2-w}P_w(Si,Ge)_{3-w}O_{12-u/2}$ (where $-0.5 \le u \le 1$, $0 < v \le 0.1$, and $0 \le w \le 0.2$); $(Y,Lu,Gd)_{2-\phi}Ca_\phi Si_4 N_{6+\phi}C_{1-\phi}:Ce^{3+}$, (wherein $0 \le \phi \le 0.5$); $(Lu,Ca,Li,Mg,Y)$, α-SiAlON doped with $Eu^{2+}$ and/or $Ce^{3+}$; $(Ca,Sr,Ba)SiO_2N_2:Eu^{2+},Ce^{3+}$; β-SiAlON:$Eu^{2+}$, 3.5MgO*0.5MgF$_2$*GeO$_2$:Mn$^{4+}$; $Ca_{1-c-f}Ce_cEu_fAl_{1+c}Si_{1-c}N_3$, (where $0 \le c \le 0.2$, $0 \le f \le 0.2$); $Ca_{1-h-r}Ce_hEu_rAl_{1-h}(Mg,Zn)_hSiN_3$, (where $0 \le h \le 0.2$, $0 \le r \le 0.2$); $Ca_{1-2s-t}Ce_s(Li,Na)_sEu_tAlSiN_3$, (where $0 \le s \le 0.2$, $0 \le f \le 0.2$, $s+t>0$); and $Ca_{1-\sigma-\chi-\phi}Ce_\sigma(Li,Na)_\chi Eu_\phi Al_{1+\sigma-\chi}N_3$, (where $0 \le \sigma \le 0.2$, $0 \le \chi \le 0.4$, $0 \le \phi \le 0.2$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

Mn$^{4+}$ doped phosphors prepared by a process according to the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

General Procedures
Stability Testing
High Light Flux Conditions

A laser diode emitting at 446 nm was coupled to an optical fiber with a collimator at its other end. The power output was 310 mW and the beam diameter at the sample was 700 microns. This is equivalent to a flux of 80 W/cm$^2$ at the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded over a period of about 21 hours by integrating the SPD from 400 nm to 500 nm and 550 nm to 700 nm respectively. The first 90 minutes of the measurement are discarded to avoid effects due to the thermal stabilization of the laser. The percentage of intensity loss due to laser damage is calculated as follows:

$$\text{Intensity loss }(\%) = 100\frac{(\text{Power} - \text{Initial power})}{\text{Initial power}}$$

While only the emitter power from the phosphor is plotted, the integrated power from the laser emission as well as its peak position was monitored to ensure that the laser remained stable (variations of less than 1%) during the experiment.

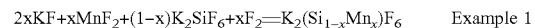

Example 1

In a plastic bottle, 0.164 g of MnF$_2$+0.227 g of KF+11.79 g of K$_2$SiF$_6$ were combined. Milling media was added and the mixture was roll milled for 1 hour. The blended powder was added to a crucible and first fired at 425° C. and then fired at 560° C. in a 20% F$_2$/80% N$_2$ atmosphere for 8 hours. The annealed material was washed in a solution of 48% HF(aq) saturated with K$_2$SiF$_6$. The washed material was vacuum filtered, rinsed with acetic acid and acetone and then dried under vacuum for 2 hours.

TABLE 1

| Example no. | | MnF$_2$ | KF | MnF$_3$ | K$_2$MnF$_6$ | K$_2$SiF$_6$ | Total wt |
|---|---|---|---|---|---|---|---|
| | mol wt. | 92.934 | 58.10 | 111.93 | 247.12 | 220.27 | |
| | assay | 0.995 | 0.990 | 0.995 | 0.995 | 0.995 | |
| | corr mol wt | 93.401 | 58.68 | 112.49 | 248.36 | 221.38 | g |
| 1 | mole ratio | 0.032 | 0.0704 | 0.0000 | 0.0000 | 0.9680 | |
| 1 | wt. (grams) | 0.164 | 0.227 | 0.000 | 0.000 | 11.786 | 12.18 |
| 2 | mole ratio | 0.000 | 0.0704 | 0.0320 | 0.0000 | 0.9680 | |
| 2 | wt. (grams) | 0.000 | 0.227 | 0.198 | 0.000 | 11.786 | 12.21 |
| 3 | mole ratio | 0.000 | 0.0000 | 0.0000 | 0.0320 | 0.9680 | |
| 3 | wt. (grams) | 0.000 | 0.000 | 0.000 | 0.437 | 11.786 | 12.22 |

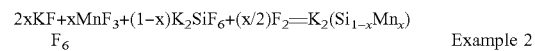

Example 2

In a plastic bottle, 0.198 g of MnF3+0.227 g of KF+11.79 g of K2SiF6 were combined in a plastic bottle. Then the procedure described in example 1 was followed.

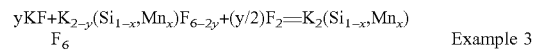

Example 3

In a plastic bottle, 0.437 g of K$_2$MnF$_6$+11.79 g of K$_2$SiF$_6$ were combined in a plastic bottle. Milling media was added and the mixture was roll milled for 1 hour. The blended powder was added to a crucible and first fired at 350° C. and second fired at 560° C. in a 20% $F_2$/80% $N_2$ atmosphere for 8 hours. The annealed material was washed in a solution of 48% HF(aq) saturated with $K_2SiF_6$. The washed material was vacuum filtered, rinsed with acetic acid and acetone and then dried under vacuum for 2 hours.

Pressed plaques of the powders of Examples 1-3 after first and second firing but before wash were fabricated. The plaques were irradiated with ultraviolet light. All samples emitted red light characteristic of $K_2SiF_6$:$Mn^{4+}$. The emission spectrum of each sample was essentially identical to that of a $K_2SiF_6$:$Mn^{4+}$ phosphor.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for preparing a $Mn^{4+}$ doped phosphor of formula I, $$A_x[MF_y]:Mn^{+4} \qquad \text{I}$$

the process comprising contacting a mixture of a compound of formula $A_x[MF_y]$, a compound of formula AX, and a $Mn^{+n}$ source comprising a fluoromanganese compound, with a fluorine-containing oxidizing agent in gaseous form, at an elevated temperature, to form the $Mn^{4+}$ doped phosphor; wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
X is F, Cl, Br, I, $HF_2$, or a combination thereof;
x is 1, 2, or 3, and is equal to the absolute value of the charge of the $[MF_y]$ ion;
y is 5, 6 or 7; and
n is 2, 3, or 4.

2. A process according to claim 1, wherein the $Mn^{4+}$ doped phosphor is $K_2SiF_6$:$Mn^{4+}$.

3. A process according to claim 1, wherein the compound of formula $A_x[MF_y]$ is $K_2SiF_6$.

4. A process according to claim 1, wherein the compound of formula AX is KF, $KHF_2$, or a combination thereof.

5. A process according to claim 1, wherein the $Mn^{+n}$ source is selected from $K_2MnF_6$, $K_2MnF_5.H_2O$, $KMnF_4$, $K_2MnF_4$, $KMnF_3$, $MnF_2$, $MnF_3$, $MnF_4$, and combinations thereof.

6. A process according to claim 1, wherein the $Mn^{+n}$ source is $K_2MnF_6$, $MnF_2$, $MnF_3$, or a combination thereof.

7. A process according to claim 1, wherein the fluorine-containing oxidizing agent is $F_2$.

8. A process according to claim 1, additionally comprising treating the phosphor in particulate form with a saturated solution of a composition of formula II in aqueous hydrofluoric acid, after contacting with the fluorine-containing oxidizing agent $$A_x[MF_y] \qquad \text{II.}$$

9. A process for preparing a $Mn^{4+}$ doped phosphor, the process comprising contacting a mixture of a host compound of the phosphor, a compound of formula AX or $EX_2$, and a $Mn^{+n}$ source comprising a fluoromanganese compound; with a fluorine-containing oxidizing agent in gaseous form, at an elevated temperature, to form the $Mn^{4+}$ doped phosphor;
wherein the host compound is selected from the group consisting of
(a) $A_2[MF_5]$, where M is selected from Al, Ga, In, and combinations thereof;
(b) $A_3[MF_6]$, where M is selected from Al, Ga, In, and combinations thereof;
(c) $Zn_2[MF_7]$, where M is selected from Al, Ga, In, and combinations thereof;
(d) $A[In_2F_7]$;
(e) $A_2[MF_6]$, where M is selected from Ge, Si, Sn, Ti, Zr, and combinations thereof;
(f) $E[MF_6]$, where E is selected from Mg, Ca, Sr, Ba, Zn, and combinations thereof; and where M is selected from Ge, Si, Sn, Ti, Zr, and combinations thereof;
(g) $Ba_{0.65}Zr_{0.35}F_{2.70}$; and
(h) $A_3[ZrF_7]$; and combinations thereof in solid solution;
A is Li, Na, K, Rb, Cs, or a combination thereof.

10. A process according to claim 9, wherein the fluorine-containing oxidizing agent is $F_2$.

11. A process for preparing a $Mn^{4+}$ doped phosphor of formula I, $$A_x[MF_y]:Mn^{+4} \qquad \text{I}$$

the process comprising contacting a mixture of a phosphor precursor and a flux compound selected from compounds of formula AX, $EX_2$, $MF_2$, or $MF_3$, or a combination thereof, with a fluorine-containing oxidizing agent in gaseous form at an elevated temperature, to form the $Mn^{4+}$ doped phosphor;
wherein
A is Li, Na, K, Rb, Cs, or a combination thereof;
E is Mg, Ca, Sr, Ba, Zn, and combinations thereof;
M is Si, Ge, Sn, Ti, Zr, Al, Ga, In, Sc, Hf, Y, La, Nb, Ta, Bi, Gd, or a combination thereof;
X is F, Cl, Br, I, $HF_2$, or a combination thereof;
x is 1, 2, or 3, and is equal to the absolute value of the charge of the $[MF_y]$ ion; and
y is 5, 6 or 7.

12. A process according to claim 11, wherein the flux compound is of formula AX.

13. A process according to claim 12, wherein the compound of formula AX is KF, $KHF_2$, or a combination thereof.

* * * * *